United States Patent
Weaver

(10) Patent No.: US 10,667,385 B2
(45) Date of Patent: May 26, 2020

(54) IMPEDANCE CONTROL USING ANTI-PAD GEOMETRIES

(71) Applicant: Arista Networks, Inc., Santa Clara, CA (US)

(72) Inventor: James A. Weaver, Santa Clara, CA (US)

(73) Assignee: Arista Networks, Inc., Santa Clara, CA (US)

( * ) Notice: Subject to any disclaimer, the term of this patent is extended or adjusted under 35 U.S.C. 154(b) by 0 days.

(21) Appl. No.: 16/150,576

(22) Filed: Oct. 3, 2018

(65) Prior Publication Data
US 2020/0113041 A1 Apr. 9, 2020

(51) Int. Cl.
*H05K 1/11* (2006.01)
*H05K 1/02* (2006.01)

(52) U.S. Cl.
CPC .......... *H05K 1/0251* (2013.01); *H05K 1/113* (2013.01); *H05K 1/115* (2013.01)

(58) Field of Classification Search
CPC ................................ H05K 1/116; H05K 1/115
See application file for complete search history.

(56) References Cited

U.S. PATENT DOCUMENTS

| | | | |
|---|---|---|---|
| 2009/0015345 A1* | 1/2009 | Kushta | H05K 1/0251 333/34 |
| 2009/0056999 A1* | 3/2009 | Kashiwakura | H05K 1/0251 174/262 |
| 2019/0098765 A1* | 3/2019 | Twarog | H05K 3/0047 |

* cited by examiner

*Primary Examiner* — Jeremy C Norris
(74) *Attorney, Agent, or Firm* — Chamberlain, Hrdlicka, White, Williams & Aughtry

(57) ABSTRACT

Embodiments of the invention may relate to a circuit board (CB). The circuit board may include a first CB layer that includes a first anti-pad having a first area, a second CB layer that includes a second anti-pad having the first area and being located substantially beneath the first anti-pad, a first via within the first anti-pad and the second anti-pad, and a first CB trace in the second CB layer. The first CB trace may be coupled to the first via to form a first transition point within a first signal propagation path. The first area may be determined, at least in part, by a depth within the CB of the second CB layer.

17 Claims, 6 Drawing Sheets

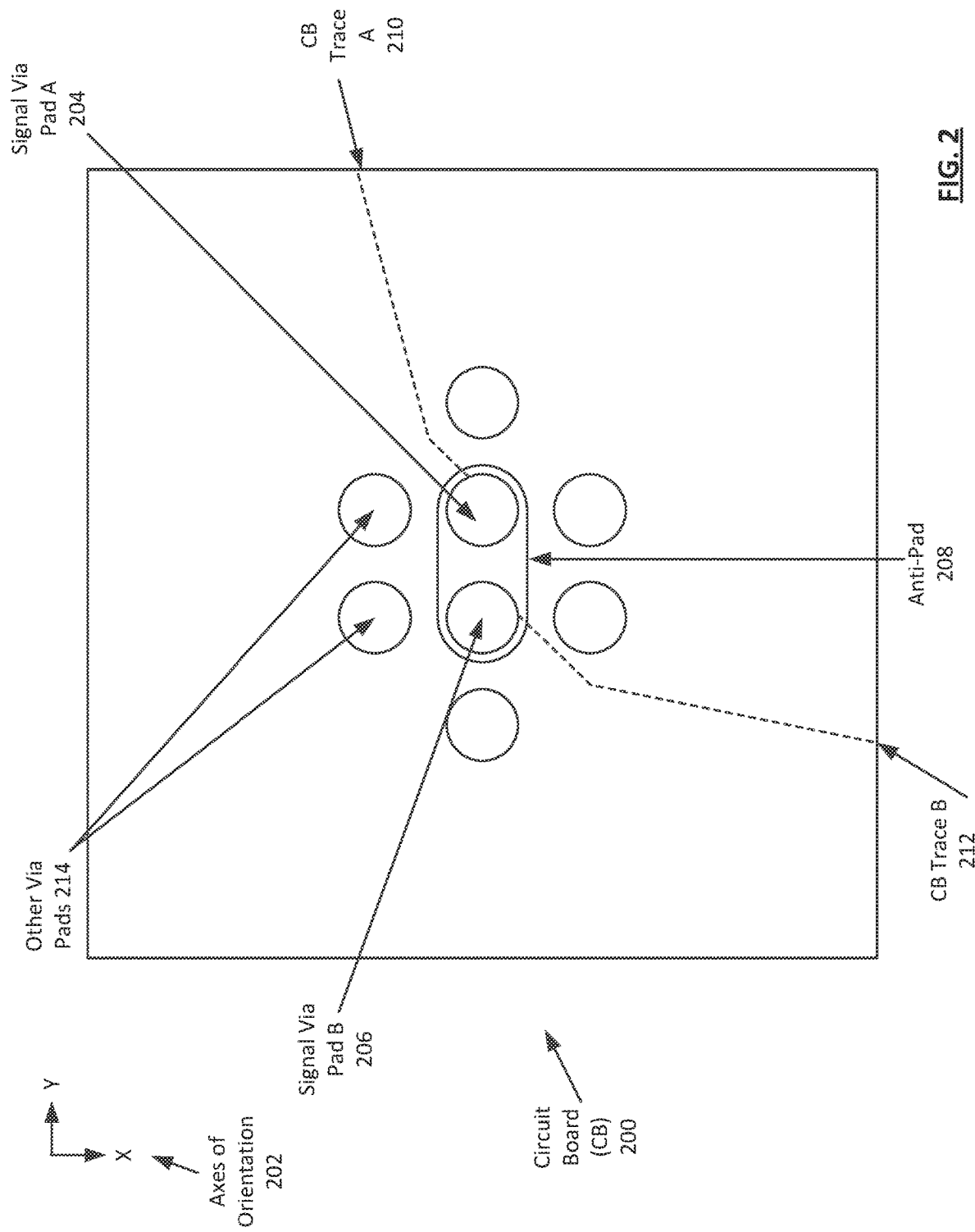

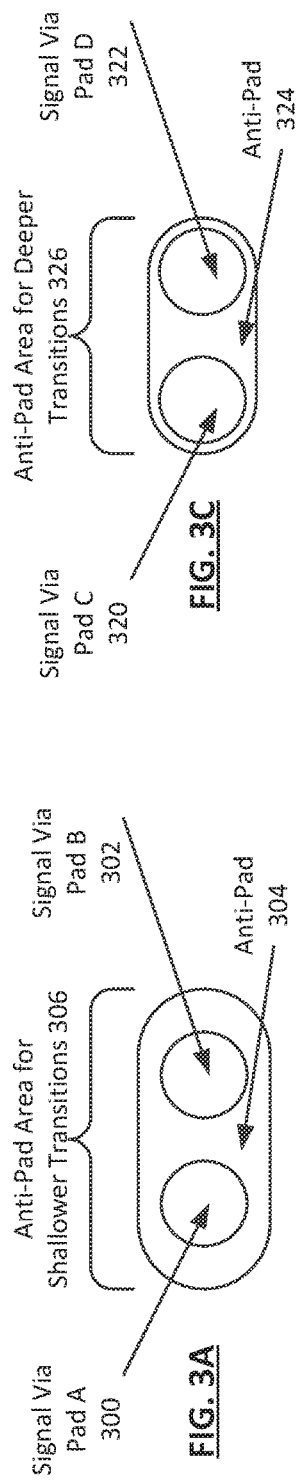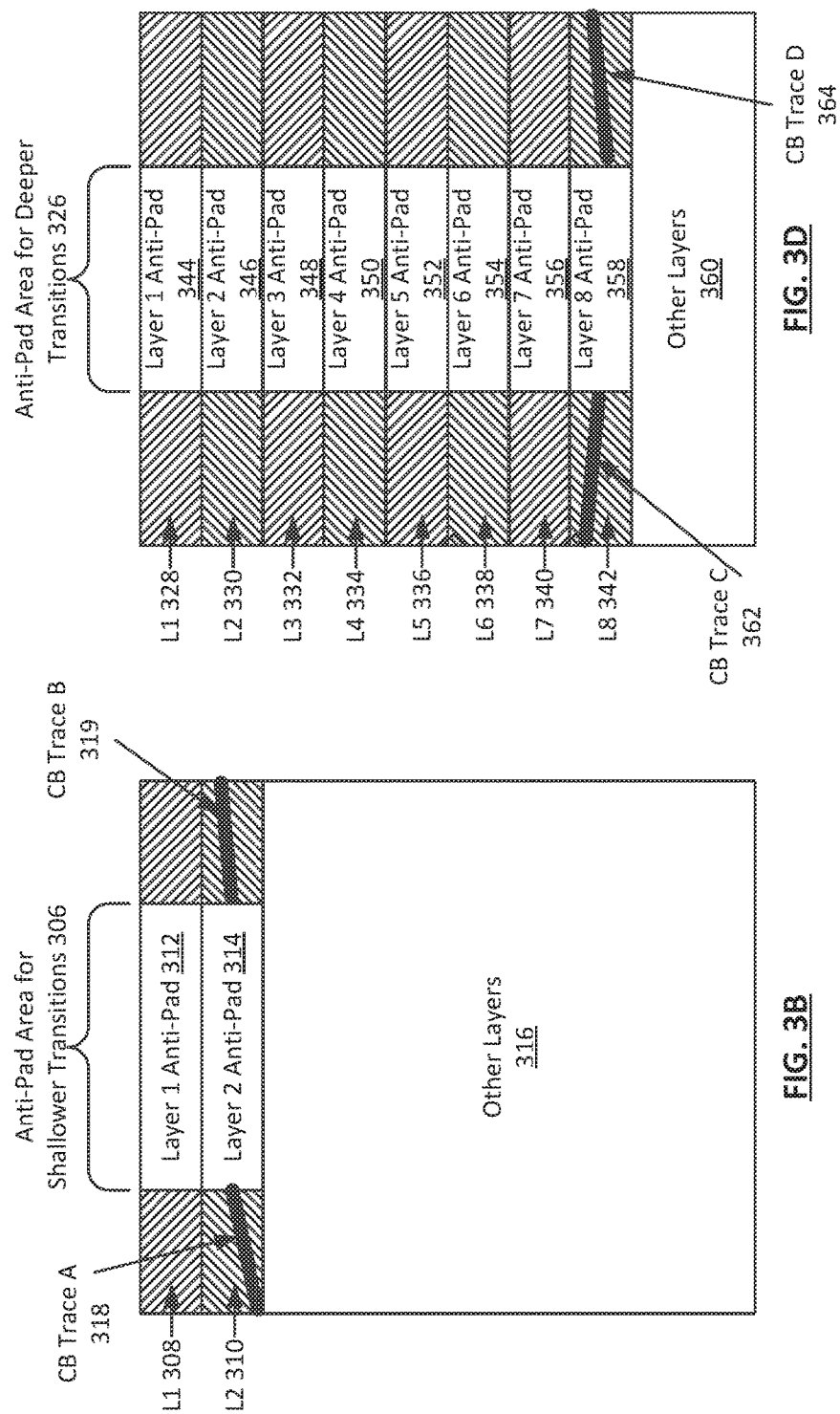

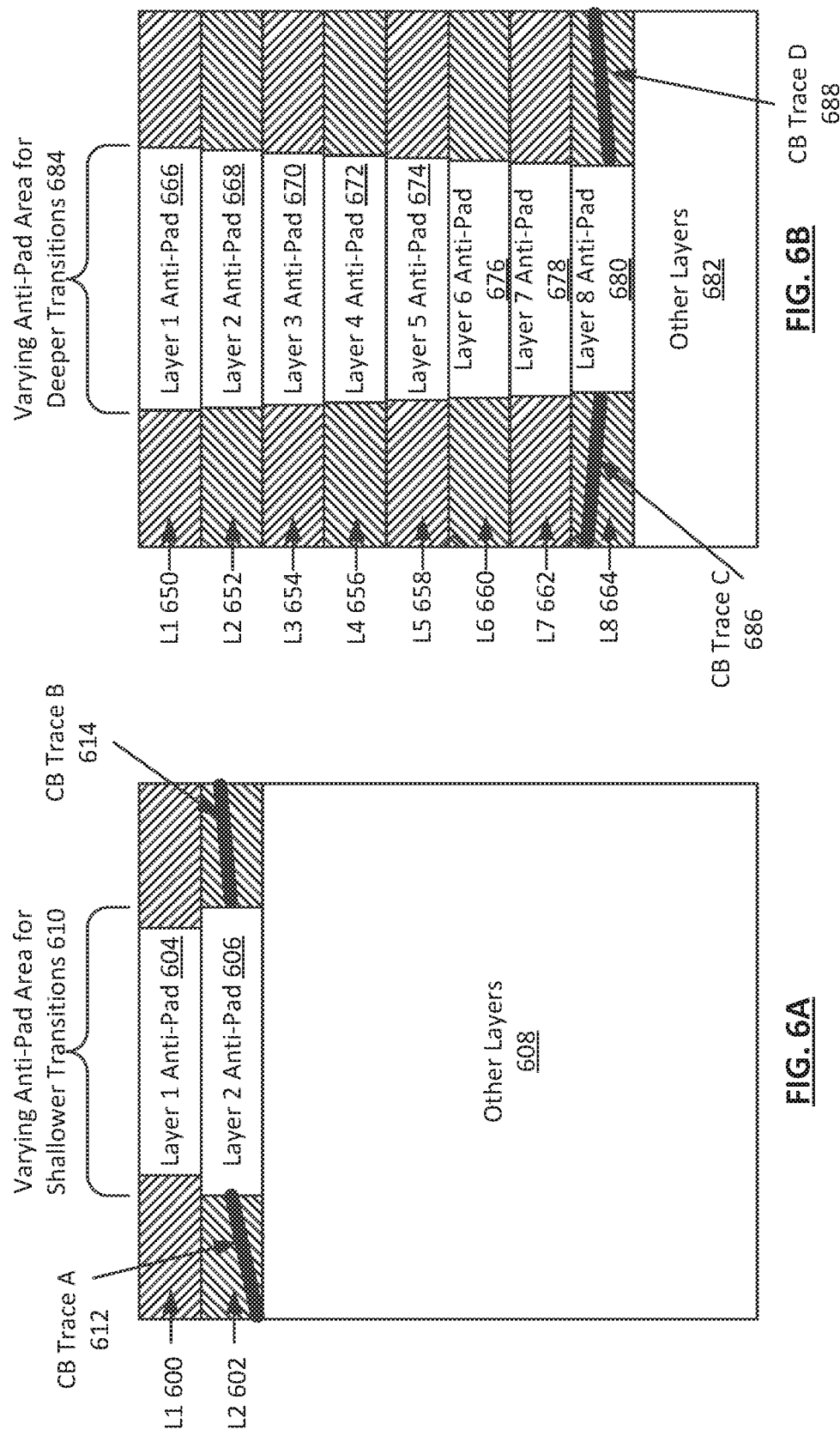

IMPEDANCE CONTROL USING ANTI-PAD GEOMETRIES

BACKGROUND

Computing devices (e.g., network devices) often include some amount of circuitry (e.g., circuit components (resistors, transistors, capacitors, inductors, diodes, power sources, transformers, modulators, oscillators, sensors, etc.), wires, wire traces, etc.) through which electric current may flow and/or be manipulated in some way. Such circuitry may, for example, be packaged as an integrated circuitry package, which, in turn, may be attached in some way to a circuit board (e.g., a printed circuit board (PCB)). Such a circuit board may provide electrical connections and/or mechanical support for any number of integrated circuitry packages, and may be attached to such integrated circuitry packages using any type of attachment technique. For example, an integrated circuitry package may be attached to a PCB using a ball grid array (BGA), which may have, for example, an array of solder bumps to be soldered to connection points, which may be referred to as via pads, on a PCB.

Electrical signal propagation paths within an integrated circuitry package may have characteristic impedances. Electrical traces within a given layer of a circuit board may also have characteristic impedances. Such impedances may or may not match one another. Additionally, once electrical signals transition from an integrated circuitry package to a circuit board, the signals may propagate through any number of layers of the circuit board using conductive vias. Such vias may carry the signals to a specific layer of a circuit board to intersect with one or more electrical traces for propagating the signals through the layer of the circuit board to some destination. The transition from the via to an electrical trace of the circuit board often has at least a temporary effect on impedance. Such a change in impedance may cause a reflection of at least a portion of the electric and/or magnetic fields associated with a propagating electric signal, which may, in turn, negatively impact the integrity of the electrical signal.

SUMMARY

In general, in one aspect, embodiments of the invention may relate to a circuit board (CB). The circuit board may include a first CB layer that includes a first anti-pad having a first area, a second CB layer that includes a second anti-pad having the first area and being located substantially beneath the first anti-pad, a first via within the first anti-pad and the second anti-pad, and a first CB trace in the second CB layer. The first CB trace may be coupled to the first via to form a first transition point within a first signal propagation path. The first area may be determined, at least in part, by a depth within the CB of the second CB layer.

In general, in one aspect, embodiments of the invention may relate to a circuit board (CB). The circuit board may include a first CB layer that includes a first anti-pad having a first area, a second CB layer comprising a second anti-pad having a second area and being located substantially beneath the first anti-pad, a first via within the first anti-pad and the second anti-pad, and a first CB trace in the second CB layer. The first CB trace may be coupled to the first via to form a first transition point within a first signal propagation path. The first area may be determined, at least in part, by a characteristic impedance of an integrated circuitry package to which the CB is attached, and the second area is determined, at least in part, by a depth within the CB of the second CB layer.

BRIEF DESCRIPTION OF DRAWINGS

FIG. 2 shows a top view of a circuit board in accordance with one or more embodiments of the invention.

FIG. 3A shows a top view of an anti-pad with vias in accordance with one or more embodiments of the invention.

FIG. 3B shows a side view of an anti-pad region of a circuit board in accordance with one or more embodiments of the invention.

FIG. 3C shows a top view of an anti-pad with vias in accordance with one or more embodiments of the invention.

FIG. 3D shows a side view of an anti-pad region of a circuit board in accordance with one or more embodiments of the invention.

FIG. 6A shows a side view of an anti-pad region of a circuit board in accordance with one or more embodiments of the invention.

FIG. 6B shows a side view of an anti-pad region of a circuit board in accordance with one or more embodiments of the invention.

DETAILED DESCRIPTION

Figure 1:
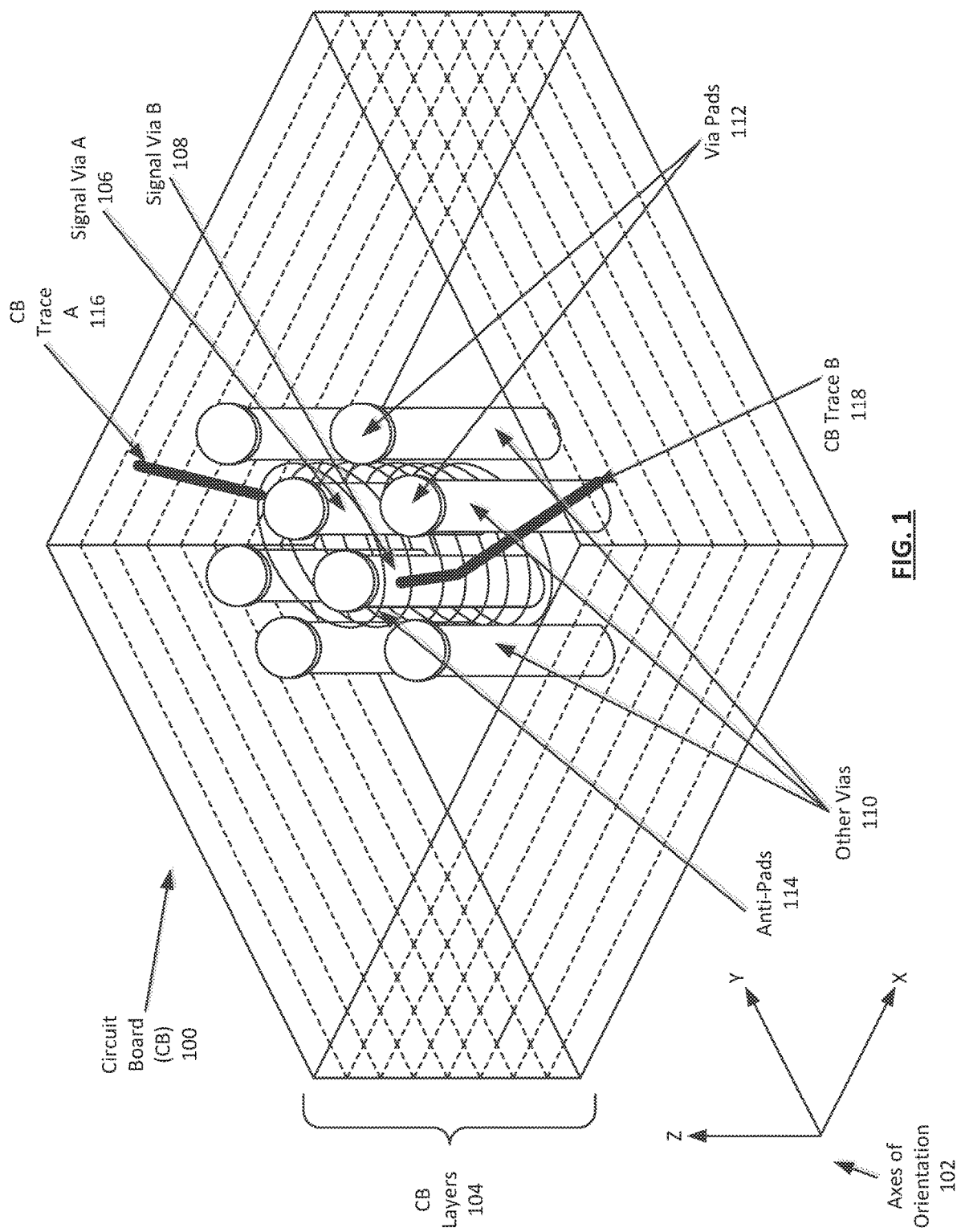
FIG. 1 shows a perspective view of a circuit board in accordance with one or more embodiments of the invention.

Specific embodiments will now be described with reference to the accompanying figures. In the following description, numerous details are set forth as examples of the invention. It will be understood by those skilled in the art, and having the benefit of this Detailed Description, that one or more embodiments of the present invention may be practiced without these specific details and that numerous variations or modifications may be possible without departing from the scope of the invention. Certain details known to those of ordinary skill in the art may be omitted to avoid obscuring the description.

In the following description of the figures, any component described with regard to a figure, in various embodiments of the invention, may be equivalent to one or more like-named components shown and/or described with regard to any other figure. For brevity, descriptions of these components may not be repeated with regard to each figure. Thus, each and every embodiment of the components of each figure is incorporated by reference and assumed to be optionally present within every other figure having one or more like-named components. Additionally, in accordance with various embodiments of the invention, any description of any component of a figure is to be interpreted as an optional embodiment, which may be implemented in addition to, in conjunction with, or in place of the embodiments described with regard to a corresponding like-named component in any other figure.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

Additionally, directional words (e.g., top, bottom, above, below, etc.) may be used as an adjective to a noun or as a relative location of an element or component. The use of directional words is not meant to imply any required orientation within any two dimensional plane or three dimensional space. For example, the use of the words "top" and "bottom" are meant to convey relative positions, rather than any fixed position. The use of such words may instead convey a spatial relationship between a component and some other component. For example, the "top" of one component (e.g., the "surface" of the component) may refer a portion of the component that is intended to be connected, at least in part, to a portion of another component, which may, in turn, be referred to as the "bottom" of the other component.

In general, embodiments of the invention relate to control of impedance, at least in part, using anti-pad geometries. Specifically, the area of an anti-pad surrounding one or more signal vias that pass through layers of a circuit board may be changed to assist in the control of impedance along a signal propagation path. More specifically, the depth (i.e., the layer) within a circuit board at which one or more electrical signals transition from a via to a conductive trace within the layer may determine, at least in part, the area of the anti-pad for each layer from the surface to at least the layer where the transition occurs. For example, deeper transitions may require smaller anti-pad geometries, while shallower transitions may require larger anti-pad geometries.

Additionally or alternatively, a difference in characteristic impedance between traces in an integrated circuitry package and a circuit board may determine, at least in part, the geometry of anti-pads in layers between the surface of the circuit board and the layer in which a transition to a trace occurs. For example, the area of an anti-pad may get gradually larger or gradually smaller per layer, or a combination thereof, depending on the depth of the transition of the signal from a via to a trace of the circuit board, and/or the relative difference in characteristic impedances of the circuit board and the integrated circuitry package.

Therefore, control of the impedance within vias of circuit boards from the surface of the board to at least the point of transition to a trace within a board layer may positively affect signal integrity. For example, electrical noise within a given signal or pair of signals may be reduced.

FIG. 1 shows a perspective view of a circuit board in accordance with one or more embodiments of the invention. As shown in FIG. 1, the circuit board (CB) (100) is positioned, for the sake of clarity, at an orientation within three dimensional space as indicated by the axes of orientation (102). In one or more embodiments of the invention, the CB (100) includes any number of CB layers (104). The CB (100) may include any number of vias (e.g., signal via A (106), signal via B (108)), any number of other vias (e.g., other vias (110)), any number of via pads (e.g., via pads (112)), any number of anti-pads (e.g., anti-pads (114)), and any number of CB traces (e.g., CB trace A (116), CB trace B (118)). Each of these components is described below.

In one or more embodiments of the invention, a CB (100) is any structure that is configured to provide electrical connections between and/or within components (e.g., circuit components, integrated circuitry packages, etc.) that are attached in any way to the CB. In one or more embodiments of the invention, a CB (100) may also provide mechanical support for any such components (e.g., within a computing device). A non-limiting example of a CB is referred to as a printed circuit board (PCB).

In one or more embodiments of the invention, a computing device is any device or any set of devices that includes circuitry. Specifically, as used herein, a computing device is any device or set of devices that includes any integrated circuitry packages attached in any way to any one or more CBs. As an example, a computing device may be any device capable of electronically processing instructions and that includes, at least, one or more processors (e.g., integrated circuitry), any amount of volatile or non-volatile memory or storage, and/or any number of input and output device(s).

Examples of computing devices include, but are not limited to, a server (e.g., a blade-server in a blade-server chassis, a rack server in a rack, etc.), a desktop computer, a mobile device (e.g., laptop computer, smart phone, personal digital assistant, tablet computer, and/or any other mobile computing device), a network device (e.g., a multilayer switch, a router, a bridge, etc.), a storage device, a media device (e.g., televisions), and/or any other type of computing device.

Such a computing device may include any number of CBs, each attached to any number of integrated circuitry packages, with the CBs and integrated circuitry packages arranged in any configuration. As an example, computing devices often include a type of CB referred to as a motherboard, to which integrated circuitry packages are connected. Other CBs (e.g., expansion cards, daughter boards, etc.) may also be connected to a motherboard, and may further be connected to additional integrated circuitry packages. All or any portion of the collection of CBs and integrated circuitry packages, along with any other computing device components, may collectively operate to perform any or all of the intended function of the computing device (e.g., process network traffic).

In one or more embodiments of the invention, a CB (100) includes CB layers (104). Although FIG. 1 shows eight CB layers (104), a CB (100) may include any number of CB layers. Each CB layer (104) may have any thickness and may be constructed of any material(s).

As an example, the CB (100) may be a PCB. In one or more embodiments of the invention, a PCB is a CB that includes a number of layers attached to one another. At least some of the CB layers (104) are conductive layers, which may be constructed from any conductive material, and which may be separated from one another by any number of non-conductive layers (e.g., a substrate) of any non-conductive material. One non-limiting example of a conductive material within a conductive layer is copper. One non-limiting example of a non-conductive material in a non-conductive layer is fiber glass. Other types of conductive and/or non-conductive materials may be included in CB layers (104) without departing from the scope of the invention.

The CB layers (104) may include any number of other layers of any type. For example, the CB (100) may have a top layer (i.e., the layer farthest in the Z direction as indicated by the axes of orientation (102)) that may be referred to as a solder mask or solder resist, which functions to help prevent shorts between solder locations at which integrated circuitry packages are attached to the CB (100). As another example, the PCB may include a layer, such as a silkscreen layer, on top of the solder mask layer that includes, for example, printed information relating to identification of components and/or locations on the CB (100).

In one or more embodiments of the invention, within conductive layers of the CB (100) are conductive traces (e.g., CB trace A (116), CB trace B (118)), which provide at least a portion of signal propagation paths through which electricity may propagate from one portion of the CB (100) to another within the conductive layer. In one or more embodiments of the invention, a signal propagation path is a conductive path through which electricity propagates. There may be any number of CB traces (116, 118) in any conductive layer of a CB (100). For example, in the embodiment shown in FIG. 1, CB trace A (116) and CB trace B (118) both exist in the layer that is second from the top of the CB (100).

In one or more embodiments of the invention, the CB traces (116, 118) operate as wires that are fixed in place within a given conductive layer of a CB (100). In one or more embodiments of the invention, the CB traces (116, 118) are separated from other portions of the conductive layer and/or from portions of other conductive layers via an insulator (e.g., air, fiber glass, etc.). In one or more embodiments of the invention, other portions within a conductive layer of a CB (100) are used for any other purpose, such as, for example, electromagnetic shielding.

CB traces (116, 118) may provide at least a portion of a signal propagation path for any type of electrical signal. Examples of such electrical signals include, but are not limited to, power signals, ground signals, or any signal that conveys any information, or any portion of any information. For example, a signal may be a signal that alternates between a higher and lower level of signal (e.g., two voltage levels), which may be interpreted as a binary signal and that conveys some form of information. As another example, the signal may be an analog signal, in which some signal feature (voltage, current, phase, etc.) may be used convey potentially changing information (e.g., pressure, velocity, temperature, etc.). As another example, two or more signals may be paired together, with the information being conveyed to a receiver by a relative difference between one or more signal properties of the signals.

In one or more embodiments of the invention, signals are passed between and/or through CB layers using vias (e.g., signal via A (106), signal via B (108), other vias (110)). A CB (100) may include any number of vias. As an example, in the embodiment shown in FIG. 1, the portion of the CB (100) shown includes eight vias. However, for the sake of clarity, only signal via A (106), signal via B (108), and three of the six other vias (110) are indicated using an arrow.

In one or more embodiments of the invention, a via (106, 108, 110) is a hole in a CB (100) that extends from one or more surfaces of the CB (e.g., the top) through any number of CB layers (104). In one or more embodiments of the invention, a via is coated (e.g., on the inside surface of the hole) with a conductive material (e.g., copper) (not shown). The electrical coating may allow the via (106, 108, 110) to serve as a conductive signal propagation path through any number of CB layers (104). Additionally or alternatively, a via (106, 108, 110) may be filled with a conductive material as opposed to being coated.

A via (106, 108, 110) may have one or more exit points at which a signal propagating along the via exits the via to a CB trace (e.g., 116, 118) within a conductive layer of the CB (100). Such an exit may occur at any conductive layer in a CB (100) and may be referred to as a transition. The exit of a signal from a via to a trace may require the signal to change the physical direction in which the signal is propagating.

For example, as shown in FIG. 1, CB trace A (116) and the via to which it is connected, signal via A (106), represent a transition that a signal must traverse when traveling from the surface of the CB to the trace. Specifically, as shown in FIG. 1, a transition in signal direction must occur because of a change from the Z direction shown on the axes of orientation (102) into a direction within the X-Y plane of the axes of orientation (i.e., a 90 degree turn).

In one or more embodiments of the invention, such a transition may cause electric and magnetic fields to be stretched near the outside of the turn, and/or compressed near the inside of the turn. Changes to electric and magnetic fields surrounding an electrical signal may affect the impedance of a signal's propagation path. For example, a portion of the signal may be reflected in a direction different from the intended direction of signal propagation (e.g., back down the path towards the source of the signal), which may degrade the quality of the signal. As an example, a ninety degree turn may be made on a signal propagation path during a transition from a via to a CB trace, which may cause the impedance of the signal propagation path to be reduced at the transition point.

In one or more embodiments of the invention, the depth within a CB (100) at which a transition from a via to a CB trace occurs has an effect on the amount of the change in impedance. For example, the more shallow (from the top of the CB) the CB layer at which the transition occurs, the more the impedance is reduced. Conversely, the deeper the CB layer at which the transition layer occurs, the less the impedance is reduced.

One type of via of the embodiment shown in FIG. 1 is referred to as a signal via (e.g., signal via A (106), signal via B (108)). In one or more embodiments of the invention, signal vias (106, 108) provide at least a portion of signal propagation paths for electrical signals intended to convey information. For example, in the embodiment shown in FIG. 1, two CB traces are in the same layer (e.g., 116, 118 in the second layer from the top), which may be used as a differential signal pair. In such an embodiment, the signal vias (106, 108) each convey one of the electrical signals that are used to convey information to a receiving entity using a difference between the electrical signals. Although the CB traces (116, 118) are shown in FIG. 1 as heading in generally opposite directions, one having ordinary skill in the art, and the benefit of this Detailed Description will recognize that the traces of a differential signal pair may have any spatial relationship with one another within a given conductive layer of a CB. For example, they may be closer to one another and generally in the same direction.

Another type of via of the embodiment shown in FIG. 1 is referred to herein as an other via (110). As discussed above, although there are six other vias shown in FIG. 1, only three are indicated with an arrow for the sake of clarity. In one or more embodiments of the invention, other vias (110) provide at least a portion of signal propagation paths through CB layers (104) for any type of electrical signal that is to be separated from other electrical signals for any reason.

As an example, in the configuration of vias shown in FIG. 1 (i.e., a six on two configuration), the two signal vias (106, 108) are used to transmit electrical signals intended to convey information, while the other vias (110) are intended to convey power and ground signals. Accordingly, the other vias (110) must be separated from the signal vias (106, 108), which may occur by the creation of anti-pads (114) around the signal vias. Anti-pads are discussed further below.

In one or more embodiments of the invention, each via (106, 108, 110) of a CB (100) has a pad (112) on the top (i.e., surface layer). For the sake of clarity, although each of the eight vias shown in FIG. 1 are shown having a pad, only two pads (112) are indicated using an arrow. In one or more embodiments of the invention, a pad is a portion of an exposed conductive material (e.g., a metal) at the surface of a CB that covers and/or is otherwise in electrical contact with a via (106, 108, 110). In one or more embodiments of the invention, a via pad is used to allow other components, such as integrated circuitry packages, to be electrically connected to a certain via of the CB (100). For example, an array of pins of an integrated circuitry package may have balls of solder attached to the pins. The balls of solder may be positioned to align with the pads of the CB, thereby allowing for an electrical connection between the pins of the integrated circuitry packages and the CB traces of the CB using the solder balls, the pads, and the underlying vias.

In one or more embodiments of the invention, any set of one or more signal vias (and the pads of the vias) may have around the set an anti-pad. For example, in the embodiment shown in FIG. 1, signal via A (106) and signal via B (108) are within the anti-pads (114) of each of the CB layers (104). For the sake of clarity, although FIG. 1 shows an anti-pad in every layer of the CB (100), the identifying arrow only points to the anti-pad in the top layer.

In one or more embodiments of the invention, an anti-pad is a clearance hole between the via and pads, and the rest of a layer of the CB (100). In one or more embodiments of the invention, an anti-pad physically separates a set of one or more vias from layers of a CB (100), and, in particular, from conducting layers of the CB, and/or from other vias (110). Such physical separation may create an electrical separation between the vias and the conductive layers and/or other vias.

For example, the other vias (110) may allow propagation of power and ground signals to certain conducive CB layers (104) from which the signal vias (106, 108) need to be electrically separated so that the signals are not shorted by the ground and/or power signals. In one or more embodiments of the invention, the anti-pads (114) may exist in any number of CB layers, may or may not create a hole through all CB layers, and may be of any shape of any area or diameter. In one or more embodiments of the invention, though not shown in FIG. 1, the areas of anti-pads is determined by the layer in which a transition occurs from a via to a CB trace. Accordingly, one set of anti-pads (114) of a CB (100) may have one area, while another set of anti-pads of a CB have a different area, which may be larger or smaller, depending on the transition depth for signals propagating using vias within the anti-pads. In one or more embodiments of the invention, though not shown in FIG. 1, the areas of anti-pads (114) may vary from layer to layer (discussed further in the description of FIG. 6, below)

While FIG. 1 shows a configuration of components, other configurations may be used without departing from the scope of the invention. For example, there may be any number of layers of any size CB, with any number of vias and via pads in any arrangement, any of which may be within any number of anti-pads. As another example, there may be any number of CB traces within any number of conductive layers of a CB. As another example though FIG. 1 shows the portion of a CB in a particular orientation as indicated by the axes of orientation, the axes of orientation are not intended to imply any particular orientation, only to show the particular perspective view related to the orientation shown in FIG. 1 within three dimensional space. Accordingly, embodiments disclosed herein should not be limited to the configuration or orientation of components shown in FIG. 1.

FIG. 2 shows a top view of a circuit board in accordance with one or more embodiments of the invention. As shown in FIG. 2, the CB (200) is positioned, for the sake of clarity, at an orientation within a two dimensional plane as indicated by the axes of orientation (202). The CB (100) may include any number of signal vias under any number of signal via pads (e.g., signal via pad A (204), signal via pad B (206)), any number of other vias under any number of other via pads (e.g., other via pads (214)), any number of anti-pads (e.g., anti-pad (208)), and any number of CB traces (e.g., CB trace A (210), CB trace B (212)). Each of these components is described below.

FIG. 2 shows a top view of the same CB (200) portion shown in the perspective view shown in FIG. 1 (i.e., CB (100)) in order to clarify certain aspects of the invention. Accordingly, the other via pads (214), the signal via pads (204) and the anti-pad (208) are each substantially similar to the like-named components shown in FIG. 1 and described above. Similarly, the CB traces (210, 212) are substantially similar to the CB traces (106, 108) shown in FIG. 1 and described above. However, in FIG. 2, the CB trace lines (210, 212) are dashed to indicate being traces in a conductive layer of the CB (200) that is beneath the top layer of the CB (200). Additionally, for the sake of clarity, the arrows indicating the other via pads (214) only point to two of the six shown other via pads.

While FIG. 2 shows a configuration of components, other configurations may be used without departing from the scope of the invention. Accordingly, embodiments disclosed herein should not be limited to the configuration of components shown in FIG. 2.

FIG. 3A shows a top view of a pair of signal via pads (300, 302) within an anti-pad (304). The signal via pads (300, 302) and anti-pad (304) are substantially similar to the like-named components discussed above and shown in FIG. 1 and FIG. 2. FIG. 3A also shows an anti-pad area for shallower transitions (306). In one or more embodiments of the invention, the anti-pad area for shallower transitions (306) is shown as relatively larger (e.g., in comparison with that shown in FIG. 3C, discussed below) based on a shallower transition from one or more vias within the anti-pad to one or more CB traces.

In one or more embodiments of the invention, the anti-pad area for shallower transitions (306) is shown as relatively larger in relation to the size of the signal via pads (300, 302) and underlying vias (not shown) due to the relative shallowness of the underlying conductive layer of a CB in which the signals propagating through the signal vias under signal pad A (300) and signal pad B (302) transition to CB traces.

A non-limiting exemplary shallower transition is shown in FIG. 3B. FIG. 3B shows a side view of the portion of a CB below the elements shown in FIG. 3A. The elements shown in FIG. 3B include the anti-pad area for shallower transitions (306), as well as the layer 1 anti-pad (312) within layer 1 (L1) (308), and the layer 2 anti-pad (314) within layer 2 (L2) (310). FIG. 3B also shows CB trace A (318) and CB trace B (319) within L2 (310). Additionally, FIG. 3B shows other layers (316).

In one or more embodiments of the invention, each of L1 (308), L2 (310) and the other layers (316) (which may include any number of CB layers) are substantially similar to the like-named CB layers (104) discussed above in the description of FIG. 1. For example, in one or more embodiments of the invention, L1 (308) is a top layer acting as a solder resist later, and L2 (310) is a conductive later. Each of the other layers (316) may be any type of CB layer. For example, the other layers (316) may include alternating non-conductive and conductive layers.

Additionally, in one or more embodiments of the invention, the layer 1 anti-pad (312) and layer 2 anti-pad (314) are substantially similar to the anti-pads discussed above in the descriptions of FIG. 1 and FIG. 2. Additionally, in one or more embodiments of the invention, CB trace A (318) and CB trace B (319) are substantially similar to the CB traces discussed above in the descriptions of FIG. 1 and FIG. 2. For the sake of clarity, the signal vias within the layer 1 anti-pad (312) and the layer 2 anti-pad (314), and the corresponding signal via pads, are not shown, though they do exist in one or more embodiments of the invention.

In the exemplary embodiment shown in FIG. 3A and FIG. 3B, the signal propagation paths includes signal via pad A (300) and signal via pad B (302), each of which passes a signal to their respective via (not shown) within the layer 1 anti-pad (312) and the layer 2 anti-pad (314). Next, as shown in FIG. 3B, the signals transition to the respective CB traces (318, 319) within L2 (310), which is a relatively shallow layer within the CB.

In one or more embodiments of the invention, the relative shallowness of the CB layer (e.g., L2 (310) in FIG. 3B) in which the transition from via to CB trace occurs leads to fabrication of the CB such that the anti-pad area (306) is relatively larger than that of other anti-pads within which signal vias of the CB exist and that have a transition which occurs in a relatively deeper CB layer. This may be, for example, because having more components and features of a CB and/or attached integrated circuitry package near shallower layers tends to drive impedance down, which combines with the impedance reduction caused by the change in direction of the signal path at the transition point. Such components and features may have less of or no effect on impedance for transition points in deeper layers of the CB, meaning that the change in impedance at such deeper layers is affected primarily by the change in direction of the signal path at the transition point, and, thus, less of a change that that seen at relatively shallower layer transition points.

In one or more embodiments of the invention, the relatively larger anti-pad area for relatively shallower signal transition layer depth keeps the impedance through the transition closer to a desired level of impedance. For example, having a larger anti-pad area for a relatively shallow transition layer depth may raise the impedance at the transition, which may offset or counteract, at least in part, the reduction in impedance caused by the transition and the various components and features near the shallower transition point. In such an example, the offsetting of the impedance reduction may keep the impedance at a more constant level. Keeping impedance at a more constant level may, for example, help reduce the noise in on or more signals (e.g., a differential signal pair making a transition to a pair of CB traces).

While FIG. 3A and FIG. 3B show a configuration of components, other configurations may be used without departing from the scope of the invention. For example, although anti-pads are shown to exist only within L1 and L2, there may be additional anti-pads within any or all of the other layers, and such other anti-pads may or may not have the same anti-pad area as the anti-pads shown in FIG. 3B. As another example, although FIG. 3B shows a transition within L2, a transition that may be considered to occur in a relatively shallow layer may be within any CB layer of a CB in which any deeper layer of transition exists. As another example, the anti-pad area shown in FIG. 3A and FIG. 3B is not meant to imply any specific area, any specific relationship between the anti-pad area and any signal vias or signal via pads, or any specific relationship between the anti-pad area and the layer depth at which a transition to a CB trace occurs. Accordingly, embodiments of the invention disclosed herein should not be limited to the configuration of components shown in FIG. 3A and FIG. 3B or described in relation thereto.

FIG. 3C shows a top view of a pair of signal via pads (320, 322) within an anti-pad (324). The signal via pads and anti-pads are substantially similar to the like-named components discussed above and shown in FIG. 1 and FIG. 2. FIG. 3C also shows an anti-pad area for deeper transitions (326). In one or more embodiments of the invention, the anti-pad area for deeper transitions (326) is shown as relatively smaller (e.g., in comparison with that shown in FIG. 3A, discussed above).

In one or more embodiments of the invention, the anti-pad area for deeper transitions (326) is shown as relatively smaller in relation to the size of the signal via pads (320, 322) and underlying vias (not shown) due to the relative deepness of the underlying conductive layer of a CB in which the signals propagating through the signal vias under signal pad C (320) and signal pad D (322) transition to CB traces.

An exemplary deeper transition is shown in FIG. 3D. FIG. 3D shows a side view of the portion of a CB below the elements shown in FIG. 3C. The elements shown in FIG. 3D include the anti-pad area for deeper transitions (326), as well as the layer 1 anti-pad (344) within L1 (328), the layer 2 anti-pad (346) within L2 (330), the layer 3 anti-pad (348) within L3 (332), the layer 4 anti-pad (350) within L4 (334), the layer 5 anti-pad (352) within L5 (336), the layer 6 anti-pad (354) within L6 (338), the layer 7 anti-pad (356) within L7 (340), and the layer 8 anti-pad (358) within L8 (342). FIG. 3D also shows CB trace C (362) and CB trace D (364) within L8 (342). Additionally, FIG. 3D shows other layers (360).

In one or more embodiments of the invention, each of L1 (328), L2 (330), L3 (332), L4 (334), L5 (336), L6 (338), L7 (340), and L8 (342) and the other layers (360) (which may include any number of CB layers) are substantially similar to the like-named CB layers (104) discussed above in the description of FIG. 1. For example, in the exemplary embodiment shown in FIG. 3D, L1 (344) is a top layer acting as a solder resist later, and L8 (342) is a conductive later. In such an example, each of the other layers (316) and L2-L7 (330-340) may be any type of CB layer. For example, the other layers (360) may include alternating non-conductive and conductive layers.

Additionally, in one or more embodiments of the invention, the anti-pads (344-358) are each substantially similar to the anti-pads discussed above in the descriptions of FIG. 1 and FIG. 2. Also, in one or more embodiments of the invention, CB trace C (362) and CB trace D (364) are substantially similar to the CB traces discussed above in the descriptions of FIG. 1 and FIG. 2. For the sake of clarity, the signal vias within the anti-pads (344-358), and their respective signal via pads, are not shown in FIG. 3D, though they do exist in one or more embodiments of the invention.

In the exemplary embodiment shown in FIG. 3C and FIG. 3D, the signal propagation paths includes signal via pad C (320) and signal via pad D (322), which pass the signals to the vias (not shown) within the anti-pads (344-358). Next, as shown in FIG. 3D, the signals transition to the respective CB traces (362, 364) within L8 (342), which is a relatively deeper layer within the CB. In one or more embodiments of the invention, the relative deepness of the CB layer in which the transition from via to CB trace occurs leads to fabrication of the CB such that the anti-pad area (326) is relatively smaller than that of the anti-pads within which other signal vias of the CB exist and that have a transition which occurs in a relatively shallower CB layer.

In one or more embodiments of the invention, the relative deepness of the CB layer (e.g., L8 (342) in FIG. 3B) in which the transition from via to CB trace occurs leads to fabrication of the CB such that the anti-pad area (326) is relatively smaller than that of other anti-pads within which signal vias of the CB exist and that have a transition which occurs in a relatively shallower CB layer. This may be, for example, because having more components and features of a CB and/or attached integrated circuitry package near shallower layers tends to drive impedance down, which combines with the impedance reduction caused by the change in direction of the signal path at the transition point. Such components and features may have less of or no effect on impedance for transition points in deeper layers of the CB (e.g., L8 (342) as shown in FIG. 3D), meaning that the change in impedance at such deeper layers is affected primarily by the change in direction of the signal path at the transition point, and therefore less than the change during transitions at shallower layers. Accordingly, in one or more embodiments of the invention, impedance may need to be lowered for deeper transitions, or the amount that impedance may need to be raised for deeper transitions may be reduced In one or more embodiments of the invention, such a lowering of impedance or reduction in the amount impedance is raised may be achieved by having relatively smaller anti-pad areas (e.g., anti-pad area (326)).

In one or more embodiments of the invention, the smaller anti-pad area for relatively deeper signal transition layer depth keeps the impedance through the transition closer to a desired level of impedance. For example, having a smaller anti-pad area for a relatively deep transition layer depth may raise the impedance at the transition, which may offset or counteract, at least in part, the reduction in impedance caused by the transition. The raise of impedance may be appropriately less than the raise in impedance caused by relatively larger anti-pad areas, which may, for example, cause an undesirable spike in impedance at the transition point. In such an example, the offsetting of the impedance reduction by a smaller amount while avoiding an unnecessary impedance spike may keep the impedance at a more constant level. Keeping impedance at a more constant level may, for example, help reduce the noise in on or more signals (e.g., a differential signal pair making a transition to a pair of CB traces).

While FIG. 3C and FIG. 3D show a configuration of components, other configurations may be used without departing from the scope of the invention. For example, although anti-pads are shown to exist only within L1-L8, there may be additional anti-pads within any or all of the other layers, and such other anti-pads may or may not have the same anti-pad area as the anti-pads shown in FIG. 3D. As another example, although FIG. 3D shows a transition within L8, a transition that may be considered to occur in a relatively deep layer may be within any CB layer of a CB in which any shallower layer of transition exists. As another example, the anti-pad area shown in FIG. 3C and FIG. 3D is not meant to imply any specific area, any specific relationship between the anti-pad area and any signal vias or signal via pads, or any specific relationship between the anti-pad area and the layer depth at which a transition to a CB trace occurs. Additionally, though shown in separate figures, the configuration of components shown in FIGS. 3A and 3B, and the configuration of components shown in FIGS. 3C and 3D, may exist in the same CB. Accordingly, embodiments disclosed herein should not be limited to the configuration of components shown in FIG. 3C and FIG. 3D.

FIGS. 4A-4D show exemplary graphs of impedance vs. time near transition points in accordance with one or more embodiments of the invention. Specifically, FIGS. 4A-4D show examples of the effect that anti-pad area has on the impedance of a signal propagation path through a transition from a via to a CB trace at different transition depths.

Figure 4A:
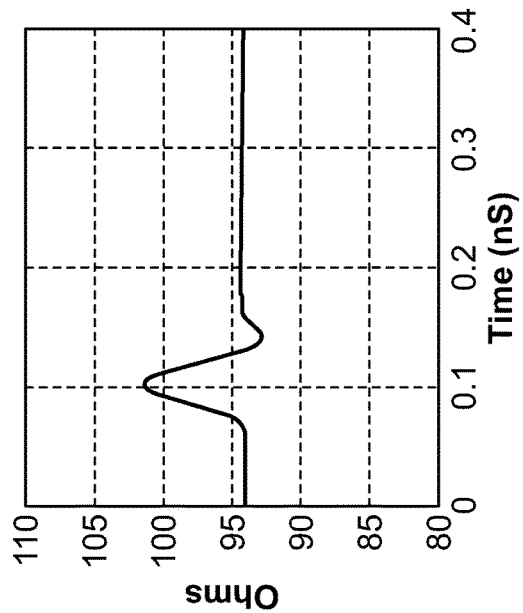
FIG. 4A shows an exemplary graph in accordance with one or more embodiments of the invention.
Figure 4B:
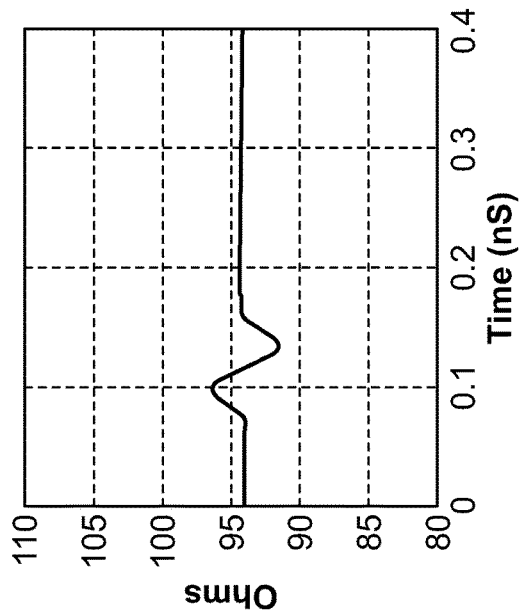
FIG. 4B shows an exemplary graph in accordance with one or more embodiments of the invention.

Turing to FIG. 4A and FIG. 4B, consider a scenario in which a signal transitions from a 94 ohm reference line through the BGA attach and then into another 94 ohm reference line. In FIG. 4A and FIG. 4B, the area of the anti-pad around a signal via is fabricated to be larger relative to the signal via and signal via pad because the PCB trace is roughly one-third of the way into the board from the top of the board (e.g., layer 8 of 26), where the BGA is attached, which may be considered a relatively shallow layer. FIG. 4A shows that the impedance achieved is very nearly a desired target impedance of 92 ohms (the lowest level occurs at 1.1 ns).

FIG. 4B shows what happens when the same anti-pad area is used with a PCB trace exiting two-thirds of the way into the board from the top (e.g., layer 19 of 26). Because of the larger anti-pad area being used at the deeper layer, the impedance is now too high (i.e., the spike to 101 ohms at 1.1 ns).

Figure 4C:
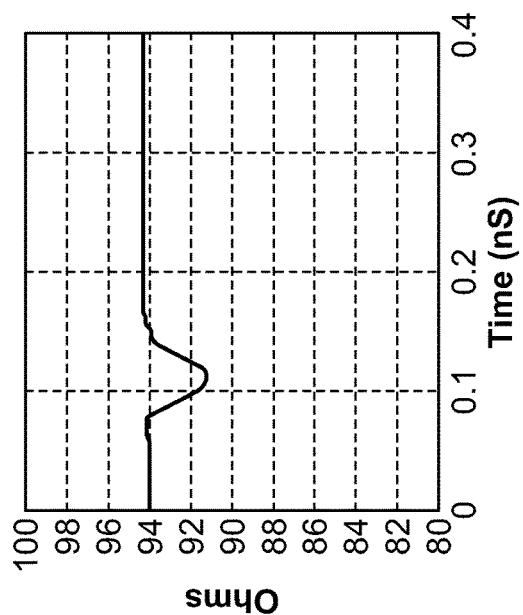
FIG. 4C shows an exemplary graph in accordance with one or more embodiments of the invention.
Figure 4D:
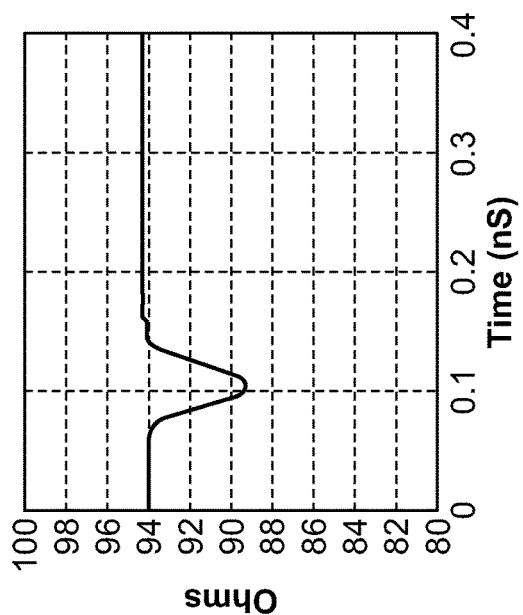
FIG. 4D shows an exemplary graph in accordance with one or more embodiments of the invention.

FIG. 4C and FIG. 4D show the results for the same two PCB trace locations as those in FIG. 4A (e.g., layer 8 out of 26) and FIG. 4B (e.g., layer 19 out of 26), but with the area of the anti-pad relative to the signal via and signal via pad decreased. Accordingly, FIG. 4D shows that the impedance for the deeper trace exit is very near the desired 92 ohm target, but the impedance for the shallow escape is too low (i.e., approximately 89 ohms at 1.1 ns), as seen in FIG. 4C.

Comparing the two figures showing relatively shallow transitions (e.g., layer 8 out of 26) from a signal via to a CB trace, FIG. 4A and FIG. 4C, shows that the impedance level remains more constant for when the anti-pad area is larger, as in FIG. 4A, than when the anti-pad area is smaller, as in FIG. 4C.

Similarly, comparing the two figures showing relatively deep transitions (e.g., layer 19 out of 26) from a signal via to a CB trace, FIG. 4B and FIG. 4D, shows that the impedance level remains more constant for when the anti-pad area is smaller, as in FIG. 4D, than when the anti-pad area is larger, as in FIG. 4B.

As discussed above, keeping the impedance closer to a desired target level may be beneficial. For example, signal noise may be reduced, which may lead to improved performance of the device or system in which a CB and an integrated circuitry package exist.

Figure 5:
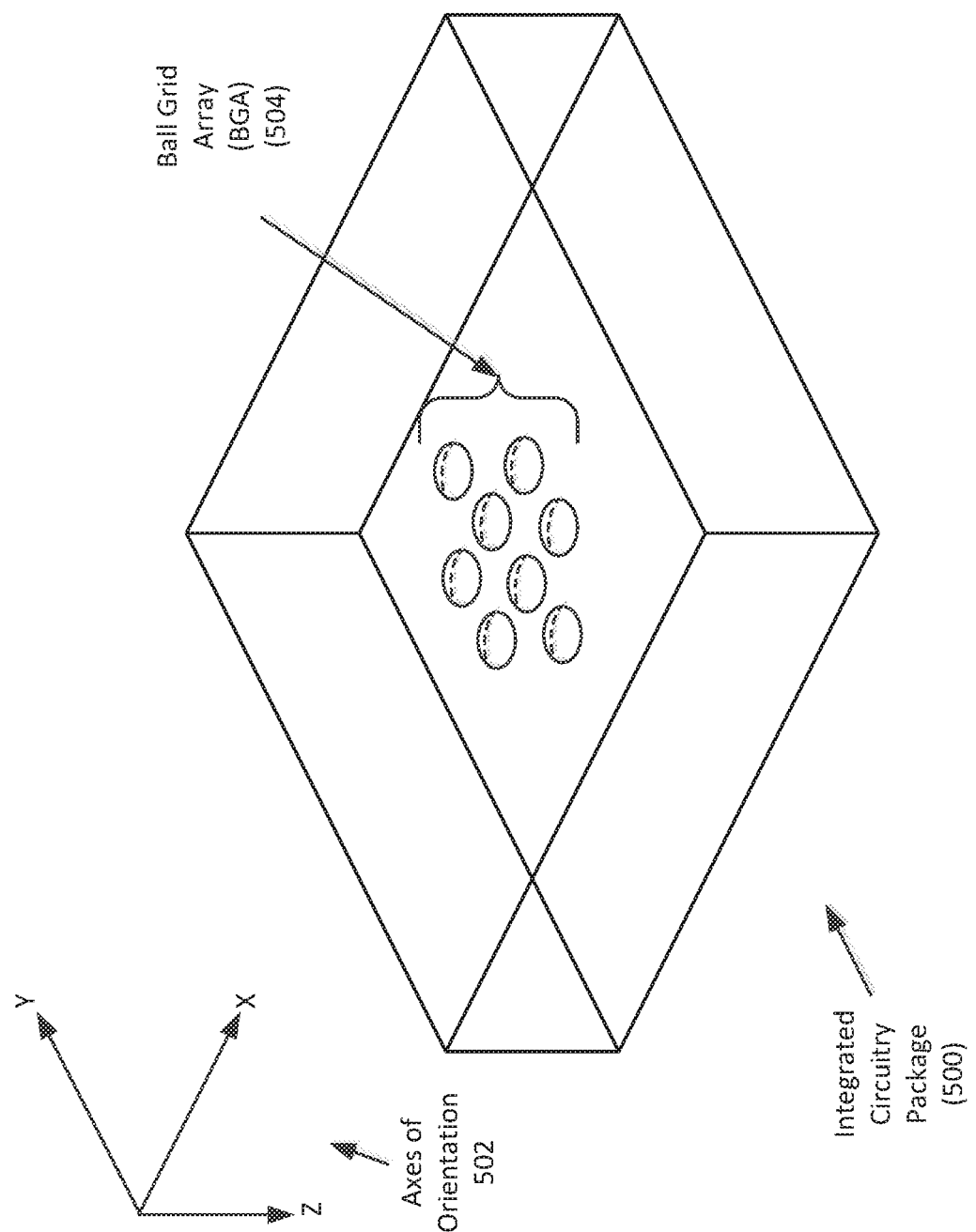
FIG. 5 shows a perspective view of an integrated circuitry package in accordance with one or more embodiments of the invention.

FIG. 5 shows a perspective view of an integrated circuitry package (500). As shown in FIG. 5, the integrated circuitry package (500) is positioned, for the sake of clarity, at an orientation within three dimensional space as indicated by the axes of orientation (502), which is opposite in the Z-direction compared to the orientation of the CB shown in FIG. 1. In one or more embodiments of the invention, the integrated circuitry package (500) has a bottom surface that includes a BGA (504). Each of these components is described below.

In one or more embodiments of the invention, an integrated circuit is a set of electronic circuits. Such circuits may include any number of circuit elements, such as, for example, resistors, transistors, capacitors, inductors, diodes, power sources or connections, transformers, modulators, oscillators, sensors, wires, wire traces, etc. In one or more embodiments of the invention, such integrated circuits are fabricated from one or more pieces of semiconducting material (e.g., silicon), on which the various circuit elements are implemented. For example, integrated circuitry may be fabricated using a variety of techniques for semiconductor device fabrication (e.g., patterning, photolithography, deposition, removal, doping, etching, etc.) on a base silicon wafer.

After fabrication, integrated circuitry may be packaged as an integrated circuitry package (500). An integrated circuitry package (500) may be any package for integrated circuitry that provides one or more connection points for the integrated circuitry to connect to any external element, such as a CB.

One example of such a package may be referred to as surface mount packaging, which may include a BGA (504). In one or more embodiments of the invention, a BGA (504) is an array of conductive balls included as part of the packaging for integrated circuitry, and providing electrical connections to one or more components therein. In one or more embodiments of the invention, each ball in a ball grid array is made of a conductive material, such as, for example, solder.

In one or more embodiments of the invention, the BGA (504) may be used to attach the integrated circuitry package, to a CB (not shown). For example, if the BGA (504) is made of solder balls, the BGA (504) may be heated, and any number of the balls of the BGA may be connected to any number of corresponding via pads (not shown) of a CB (not shown). Such connections may provide a conductive path through which a signal may propagate. For example, a signal (e.g., power, ground, informational, etc.) may go through a portion of the integrated circuitry, through a solder ball of a BGA, through a corresponding copper via pad of a CB to which the solder ball is attached, into a via, and through the via to reach a conductive layer in the CB at which the signal transitions into a CB trace of the CB.

As shown in FIG. 5, the integrated circuitry package (500) includes eight balls in the BGA (504), which are in an arrangement similar to the arrangement of the via pads shown in FIG. 1 and FIG. 2 in order to show that the BGA may be used to attach the integrated circuitry package (500) to a CB such as that shown in FIG. 1.

While FIG. 5 shows a configuration of components, other configurations may be used without departing from the scope of the invention. For example, the integrated circuitry package may be of any size or shape and include any amount of integrated circuitry. As another example, there may be any number of BGA connection locations (e.g., solder ball locations) on the integrated circuitry package for connecting to any number of via pads of a CB. As another example though FIG. 5 shows a portion of an integrated circuitry package in a particular orientation as indicated by the axes of orientation, the axes of orientation are not indented to imply any particular orientation, only to show the particular perspective view related to the orientation shown in FIG. 5 within three dimensional space. Accordingly, embodiments disclosed herein should not be limited to the configuration or orientation of components shown in FIG. 5.

FIG. 6A and FIG. 6B show one or more embodiments of the invention in which the anti-pad areas within CB layers change from layer to layer. In one or more embodiments of the invention, a signal propagation path in an integrated circuitry package, including a BGA, may have a certain characteristic impedance. Additionally, a CB (or certain layers or traces therein) may also have a certain characteristic impedance. In one or more embodiments of the invention, the impedances of a CB and an integrated circuitry package may not match each other. Additionally, the impedance of a via pad and underlying via within an anti-pad may be either higher or lower than the impedance of the integrated circuitry package. Accordingly, in order to ultimately have the impedance of the signal propagation path be at a desired level by the time a signal reaches a layer within a CB at which the signal transitions to a CB trace, while minimizing abrupt changes in impedance, the impedance may be controlled, at least in part, by varying the size of the anti-pads around one or a set of signal vias on a layer-by-layer basis.

FIG. 6A shows a side view of an exemplary embodiment of the invention that includes a varying anti pad area for shallower transitions (610). FIG. 6A also shows a layer 1 anti-pad (604) having a smaller area within L1 (600), a layer 2 anti-pad (606) having a larger area within L2 (602), and other layers (608). L2 (602) also includes CB trace A (612) and CB Trace B (614). Each of the components is described below.

In one or more embodiments of the invention, the varying anti-pad area for shallower transitions (610) is shown as having a smaller layer 1 anti-pad (604) area relative to the layer 2 anti-pad area (606). The variance exists in the exemplary embodiment shown in FIG. 6A because the impedance of the integrated circuitry package (not shown) to which the signal via pad (not shown) and via (not shown) are electrically connected is at a certain value, and that value is different than the value of the desired impedance at the layer at which the transition from via to CB trace (e.g., 612, 614) occurs. Therefore, the anti-pad area is smaller in order to have the impedance of the signal propagation path remain closer to constant as the signal transitions from the integrated circuitry package (not shown) to the CB using the BGA (not shown) and the vias and via pads within the anti-pads (604, 606). In one or more embodiments of the invention, the larger area of the layer 2 anti-pad (606) raises the impedance at L2 (602), which may be desired in order to offset the drop in impedance that occurs due to the transition and the relative shallowness of the layer in which the transition to a CB trace occurs.

In one or more embodiments of the invention, each of L1 (600), L2 (602) and the other layers (608) (which may include any number of CB layers) are substantially similar to the like-named CB layers (104) discussed above in the description of FIG. 1. For example, in one or more embodiments of the invention, L1 (600) is a top layer acting as a solder resist later, and L2 (602) is a conductive later. Each of the other layers (608) may be any type of CB layer. For example, the other layers (608) may include alternating non-conductive and conductive layers.

Additionally, in one or more embodiments of the invention, the layer 1 anti-pad (604) and layer 2 anti-pad (606) are substantially similar to the anti-pads discussed above in the descriptions of FIG. 1 and FIG. 2. Also, in one or more embodiments of the invention, CB trace A (612) and CB trace B (614) are substantially similar to the CB traces discussed above in the descriptions of FIG. 1 and FIG. 2. For the sake of clarity, the signal vias within the layer 1 anti-pad (604) and the layer 2 anti-pad (606), and the corresponding signal via pads, are not shown, though they do exist in one or more embodiments of the invention.

In the exemplary embodiment shown in FIG. 6A, the signal propagation paths includes the integrated circuitry (not shown) of an integrated circuitry package (not shown), balls (not shown) of the BGA (not shown), signal via pad A (not shown) and signal via pad B (not shown), each of which passes a signal to their respective via (not shown) within the layer 1 anti-pad (604) and the layer 2 anti-pad (606). Next, as shown in FIG. 6A, the signals transition to the respective CB traces (612, 614) within L2 (602), which is a relatively shallow layer within the CB.

In one or more embodiments of the invention, the relative shallowness of the CB layer (e.g., L2 (602) in FIG. 3B) in which the transition from via to CB trace occurs leads to fabrication of the CB such that the anti-pad area (606) is relatively larger in the transition layer (i.e., L2 (602) as shown in FIG. 6A) than that of other anti-pads within which signal vias of the CB exist and that have a transition which occurs in a relatively deeper CB layer. However, in order to have the impedance of the BGA-via pad transition more closely match, the area of the layer 1 anti-pad (604), as shown in FIG. 6A, is less than the area of the layer 2 anti-pad (606).

In one or more embodiments of the invention, the relatively larger anti-pad area for relatively shallower signal transition layer depth keeps the impedance through the transition from the via to the CB trace closer to a desired level of impedance, while the relatively smaller anti-pad area at the top layer keeps the impedance through the transition from the integrated circuitry package to the CB closer to a desired level of impedance (e.g., so that the impedance at the package to CB transition is closer to that of the package). Keeping impedance at a more constant level may, for example, help reduce the noise in on or more signals.

While FIG. 6A shows a configuration of components, other configurations may be used without departing from the scope of the invention. For example, although anti-pads are shown to exist only within L1 and L2, there may be additional anti-pads within any or all of the other layers, and such other anti-pads may or may not have the same anti-pad area as the anti-pads shown in FIG. 6A. As another example, although FIG. 6A shows a transition within L2, a transition that may be considered to occur in a relatively shallow layer may be within any CB layer of a CB in which any deeper layer of transition exists. As another example, the anti-pad areas shown in FIG. 6A are not meant to imply any specific area, any specific relationship between an anti-pad area and any signal vias or signal via pads, or any specific relationship between the anti-pad area and the layer depth at which a transition to a CB trace occurs. Accordingly, embodiments of the invention disclosed herein should not be limited to the configuration of components shown in FIG. 6A or described in relation thereto.

FIG. 6B shows a side view of an exemplary embodiment of the invention that includes a varying anti pad area for deeper transitions (684). FIG. 6B also shows a layer 1 anti-pad (666) within L1 (650), a layer 2 anti-pad (668) within L2 (652), a layer 3 anti-pad (670) within L3 (654), a layer 4 anti-pad (672) within L4 (656), a layer 5 anti-pad (674) within L5 (658), a layer 6 anti-pad (676) within L6 (660), a layer 7 anti-pad (678) within L7 (662), a layer 8 anti-pad (680) within L8 (664), and other layers (682). L8 (664) also includes CB trace C (686) and CB Trace D (688). Each of the components is described below.

In one or more embodiments of the invention, the varying anti-pad area for deeper transitions (684) is shown as having a larger layer 1 anti-pad (666) area relative to the layer 2 anti-pad (668) area, with each successive deeper layer anti-pad (670-680) having a successively smaller anti-pad area. The variance exists in the exemplary embodiment shown in FIG. 6B because the impedance of the integrated circuitry package (not shown) to which the signal via pad (not shown) and via (not shown) are electrically connected is at a certain value, and that value is different than the value of the desired impedance at the layer at which the transition from via to CB trace (e.g., 686, 688) occurs. Therefore, the anti-pad area of the layer 1 anti-pad (666) is larger in order to have the impedance of the signal propagation path remain closer to a desired value as the signal transitions from the integrated circuitry package (not shown) to the CB using the BGA (not shown) and the vias and via pads within the anti-pads (666-680). In one or more embodiments of the invention, the layer 1 anti-pad (666) has the largest area of the anti-pads, with each anti-pad beneath the layer 1 anti-pad (666) having a successively smaller area until the layer 8 anti-pad is reached. In one or more embodiments of the invention, the smaller area of the layer 8 anti-pad (680) lowers the impedance at L2 (602), which may be desired in order to offset the change in impedance that occurs due to the transition in L8 (664) from the vias (not shown) to the CB traces (686, 688), in order to avoid an undesired spike in impedance.

In one or more embodiments of the invention, each of L1-L8 (666-680) and the other layers (682) (which may include any number of CB layers) are substantially similar to the like-named CB layers (104) discussed above in the description of FIG. 1. For example, in one or more embodiments of the invention, L1 (650) is a top layer acting as a solder resist later, and L8 (664) is a conductive later. Each of the other layers (682) may be any type of CB layer. For example, the other layers (682) may include alternating non-conductive and conductive layers.

Additionally, in one or more embodiments of the invention, the anti-pads (666-680) are substantially similar to the anti-pads discussed above in the descriptions of FIG. 1 and FIG. 2. Additionally, in one or more embodiments of the invention, CB trace C (686) and CB trace D (688) are substantially similar to the CB traces discussed above in the descriptions of FIG. 1 and FIG. 2. For the sake of clarity, the signal vias within the anti-pads (666-680), and the corresponding signal via pads, are not shown, though they do exist in one or more embodiments of the invention.

In the exemplary embodiment shown in FIG. 6B, the signal propagation paths includes the integrated circuitry package (not shown), balls (not shown) of the BGA (not shown), signal via pad C (not shown) and signal via pad D (not shown), each of which passes a signal to their respective via (not shown) within the anti-pads (666-680). Next, as shown in FIG. 6B, the signals transition to the respective CB traces (686, 688) within L8 (664), which is a relatively deep layer within the CB.

In one or more embodiments of the invention, the relative deepness of the CB layer (e.g., L8 (664) in FIG. 3B) in which the transition from via to CB trace occurs leads to fabrication of the CB such that the anti-pad area (680) is relatively smaller in the transition layer (i.e., L8 (664) as shown in FIG. 6B) than that of other anti-pads within which signal vias of the CB exist and that have a transition which occurs in a relatively shallower CB layer. However, in order to have the impedance at the BGA-via pad transition more closely match, the area of the layer 1 anti-pad (666), as shown in FIG. 6A, is larger than the area of the layer 2 anti-pad (680).

In one or more embodiments of the invention, the relatively smaller anti-pad area for relatively deeper signal transition layer depth keeps the impedance through the transition from the via to the CB trace closer to a desired level of impedance, while the relatively larger anti-pad area at the top layer keeps the impedance through the transition from the integrated circuitry package to the CB closer to a desired level of impedance (e.g., so that the impedance at the package to CB transition is closer to that of the package). Keeping impedance at a more constant level may, for example, help reduce the noise in on or more signals.

While FIG. 6B shows a configuration of components, other configurations may be used without departing from the scope of the invention. For example, although anti-pads are shown to exist only within L1-L8, there may be additional anti-pads within any or all of the other layers, and such other anti-pads may or may not have the same anti-pad area as the anti-pads shown in FIG. 6B. As another example, although FIG. 6B shows a transition within L8, a transition that may be considered to occur in a relatively deep layer may be within any CB layer of a CB in which any shallower layer of transition exists. As another example, the anti-pad areas shown in FIG. 6B are not meant to imply any specific area, any specific relationship between an anti-pad area and any signal vias or signal via pads, or any specific relationship between the anti-pad area and the layer depth at which a transition to a CB trace occurs. Accordingly, embodiments of the invention disclosed herein should not be limited to the configuration of components shown in FIG. 6B or described in relation thereto.

Embodiments of the invention described above allow for at least partial control of impedance as a signal propagation path transitions from a via to a CB trace and/or from an integrated circuitry package BGA to a CB. Such control of the impedance may improve the characteristics of a signal propagating through the signal propagation path. For example, signal noise may be reduced by keeping the impedance closer to a desired impedance level, and/or by having impedances of various components or sections of components be closer to one another at a transition point (e.g., from a BGA to a via pad, or from a via to a CB trace).

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A circuit board (CB), comprising:
   a first CB layer comprising a first anti-pad having a first area;
   a second CB layer comprising a second anti-pad having the first area and being located substantially beneath the first anti-pad;
   a first via within the first anti-pad and the second anti-pad;
   a first CB trace in the second CB layer, the first CB trace coupled to the first via to form a first transition point within a first signal propagation path;
   a third CB layer comprising a third anti-pad having a second area and being located at a different location in the CB than the first anti-pad and the second anti-pad;
   a second via within the third anti-pad; and
   a second CB trace in the third CB layer, the second CB trace coupled to the second via to form a second transition point within a second signal propagation path,
   wherein when the depth of the second CB layer is shallower than the depth of the third CB layer, the first area is larger than the second area.

2. The CB of claim 1, wherein the larger area of the first area raises an impedance of the first signal propagation path at the first transition point.

3. The CB of claim 1, further comprising:
   a first via pad coupled to the first via and to a portion of a ball grid array (BGA) of an integrated circuitry package.

4. The CB of claim 3, wherein the portion of the BGA of the integrated circuitry package, the first via pad, the first via, and the first CB trace form at least a portion of the first signal propagation path.

5. The CB of claim 1, further comprising:
   a plurality of CB layers between the first CB layer and the second CB layer, wherein each of the plurality of CB layers comprises an anti-pad having the first area.

6. The CB of claim 1, further comprising:
   a plurality of CB layers below the second CB layer, wherein each of the plurality of CB layers comprises an anti-pad having an area different from the first area.

7. The CB of claim 1, further comprising:
   a third via within the first anti-pad and the second anti-pad; and
   a third CB trace in the second CB layer, the third CB trace coupled to the third via to form a second transition within a third signal propagation path,
   wherein the first CB trace and the second CB trace provide a differential signal propagation path.

8. The CB of claim 1, wherein the first via and the first CB trace comprise a conductive material.

9. The CB of claim 8, wherein the first CB layer comprises a non-conductive material.

10. A circuit board (CB), comprising:
    a first CB layer comprising a first anti-pad having a first area;
    a second CB layer comprising a second anti-pad having a second area and being located substantially beneath the first anti-pad;
    a first via within the first anti-pad and the second anti-pad; and
    a first CB trace in the second CB layer, the first CB trace coupled to the first via to form a first transition point within a first signal propagation path,
    wherein the first area is determined, at least in part, by a characteristic impedance of an integrated circuitry package to which the CB is attached, and the second area is determined, at least in part, by a depth within the CB of the second CB layer, and
    wherein each of a plurality of CB layers between the first CB layer and the second CB layer comprises an anti-pad having an anti-pad area larger than the first area and smaller than the second area, or each of the plurality of CB layers comprises an anti-pad having an anti-pad area smaller than the first area and larger than the second area.

11. The CB of claim 10, wherein the first area is smaller than the second area.

12. The CB of claim 11, wherein each of the plurality of CB layers comprises an anti-pad having an anti-pad area that is larger than an immediately above anti-pad area and smaller than an immediately below anti-pad area.

13. The CB of claim 10, wherein the first area is larger than the second area.

14. The CB of claim 13, wherein each of the plurality of CB layers comprises an anti-pad having an anti-pad area that is smaller than an immediately above anti-pad area and larger than an immediately below anti-pad area.

15. The CB of claim 10, further comprising:
a first via pad coupled to the first via and to a portion of a ball grid array (BGA) of the integrated circuitry package, wherein the portion of the BGA of the integrated circuitry package, the first via pad, the first via, and the first CB trace form at least a portion of the first signal propagation path.

16. A circuit board (CB), comprising:
a first CB layer comprising a first anti-pad having a first area;
a second CB layer comprising a second anti-pad having the first area and being located substantially beneath the first anti-pad;
a first via within the first anti-pad and the second anti-pad;
a first CB trace in the second CB layer, the first CB trace coupled to the first via to form a first transition point within a first signal propagation path;
a third CB layer comprising a third anti-pad having a second area and being located at a different location in the CB than the first anti-pad and the second anti-pad;
a second via within the third anti-pad; and
a second CB trace in the third CB layer, the second CB trace coupled to the second via to form a second transition point within a second signal propagation path,
wherein when the depth of the second CB layer is deeper than the depth of the third CB layer, the first area is smaller than the second area.

17. The CB of claim 16, wherein the smaller area of the first area lowers an impedance of the first signal propagation path at the first transition point.

* * * * *